(12) United States Patent  
Shakeri et al.

(10) Patent No.: US 7,433,812 B2
(45) Date of Patent: Oct. 7, 2008

(54) BLOCK DIAGRAM MODELING

(75) Inventors: Mojdeh Shakeri, Southborough, MA (US); Marc Ullman, Framingham, MA (US); Ramamurthy Mani, Newton, MA (US)

(73) Assignee: The MathWorks, Inc., Natick, MA (US)

(*) Notice: Subject to any disclaimer, the term of this patent is extended or adjusted under 35 U.S.C. 154(b) by 692 days.

(21) Appl. No.: 09/870,280

(22) Filed: May 30, 2001

(65) Prior Publication Data

US 2002/0183998 A1    Dec. 5, 2002

(51) Int. Cl.
*G06F 17/50* (2006.01)
*G06F 3/048* (2006.01)
*G09G 5/02* (2006.01)
*G05B 13/02* (2006.01)

(52) U.S. Cl. .................. 703/15; 715/782; 345/594; 706/23

(58) Field of Classification Search .................. 703/15, 703/2; 715/782; 345/594; 706/23
See application file for complete search history.

(56) References Cited

U.S. PATENT DOCUMENTS 5,475,851 A * 12/1995 Kodosky et al. ............ 715/763
5,920,489 A * 7/1999 Dibrino et al. ................ 716/2
6,539,027 B1 * 3/2003 Cambron .................... 370/442

OTHER PUBLICATIONS

Paredis et al., "Composable Models for Simulation-based Design" Carnegie Mellon University. Apr. 21, 2000 p. 1-14.*
"Mathworks MATLAB Digest" Jul. 1997. p. 1-25 www.utoronto.ca/cat/services/matlab_files/matlab/digest/V5.2.*
System View by Elanix. http://www.hit.bme.hu/mcl/svmeres/SVUGuide.pdf (1994-1999) p. 1-291.*
Paradis et al. "Composable Models for Simulation-Based Design" (Apr. 2000) www.cs.cmu.edu/'compsim p. 1-14.*
Deb et al., "Multi-Signal Flow Graphs: A Novel Approach for Sytems Testibility Analysis and Fault Diagnosis" IEEE AES Systems Magazine May 1995. p. 1-13.*
Winter et al., "Blockism—Application of Non-Linear Modelling and Simulation in Fuzzy Control System Design" IEEE 1994 p. 1337-1342.*
Ghoshal et al., "Multi-signal Modeling for Diagnosis, FMECA, and Reliability" 1998 IEEE p. 3026-3031.*
Matlab News and Notes. Feb. 2000 Matlab News Letter. p. 1-18.*
Bishop,R.H., "Modern Control Systems Analysis & Design" 1997, Univ of Texas (Austin), p. 4-5, 7-15, and 96-100.*
Hiyama et al., "Matlab/Simulink based Transient Stability Simulation of Electric Power Systems" 1998 IEEE p. 249-253.*
Davari et al., "On-line Control of a Real System with MATLAB/SIMULINK" 1998 Univ of W. Virginia p. 7-9.*
Dwan et al., "Introducing SIMULINK into a Systems Engineering Curriculum" 1993 Renewing America's Technology Proceedings p. 627-631.*
Austin et al.,titled, "Structure Matrix Computations with Units" 2000 ASCE pp. 174-182.*
Jantsch et al., "Composite Signal Flow: A compuational Model Combingin Events, Sampled Streams and Vectors" IEEE Mar. 2000 p. 154-160.*

* cited by examiner

*Primary Examiner*—Albert DeCady
*Assistant Examiner*—Thomas H Stevens
(74) *Attorney, Agent, or Firm*—Lahive & Cockfield, LLP; Kevin J. Canning

(57) ABSTRACT

A modeling process includes providing blocks, each of the blocks representing functional entities that operate on input signal values, output signal values from the blocks, grouping the output signal values as an ordered set in a multiplexer as a first composite signal and outputting the first composite signal.

34 Claims, 6 Drawing Sheets

BLOCK DIAGRAM MODELING

TECHNICAL FIELD

This invention relates to block diagram modeling.

BACKGROUND

Dynamic real-world systems such as electrical circuits, shock absorbers, braking systems, and many other electrical, mechanical and thermodynamic systems may be modeled, simulated and analyzed on a computer system using block diagram modeling. Block diagram modeling graphically depicts time-dependent mathematical relationships among a system's inputs, states and outputs, typically for display on a graphical user interface (GUI). Block diagram modeling may also be used to simulate the behavior of a system for a specified time span.

SUMMARY

According to one aspect of the invention, a modeling process includes providing a plurality of blocks, each of the blocks representing functional entities that operate on a plurality of input signal values, generating a plurality of output signal values from the plurality of blocks, grouping the plurality of output signal values as an ordered set in a multiplexer as a first composite signal and outputting the first composite signal.

One or more of the following features may also be included. Each of the blocks includes at least one output signal port. A plurality of input signal values and the output signal values have at least one attribute. The attribute may be a name, a data type, a numeric value and/or a dimensionality. The ordered set is a linked list data structure. The linked list data structure is a tree data structure, the tree data structure including m+n nodes. m represents a number of independent signals and n represents a number of composite signals.

The process further includes decomposing the first composite signal into the plurality of output signals in a demultiplexer.

The process further includes viewing the ordered set contained in the first composite signal with a composite signal viewer.

At least one of the input signal values is a second composite signal.

According to another aspect of the invention, a block diagram modeling process includes providing a first block and a second block, the blocks representing functional entities, generating a plurality of output signal values from the first and second block, grouping the plurality of output signal values as an ordered set in a multiplexer as a first composite signal and processing the composite signal in a third block.

One of more of the following features may also be included. The ordered set is a linked list data structure. At least one of the input signals is a second composite signal.

The process further includes decomposing the composite signal into a plurality of input signal values.

The process further includes viewing the composite signal in a composite signal viewer. The composite signal viewer displays the ordered set contained in the composite signal on a graphical user interface (GUI). The GUI is provided on an input/output device.

In another aspect, the invention features a computer program product residing on a computer readable medium having instructions stored thereon which, when executed by the processor, cause the processor to provide a plurality of blocks, each of the blocks representing functional entities, generate a plurality of output signal values from the plurality of blocks, group the plurality of output signal values as an ordered set in a multiplexer as a first composite signal and output the first composite signal.

One or more of the following features may also be included. The computer readable medium is a random access memory (RAM). The computer readable medium is read only memory (ROM). The computer readable medium is hard disk drive.

In another aspect, the invention features a processor and a memory configured to provide a plurality of blocks, each of the blocks representing functional entities, generate a plurality of output signal values from the plurality of blocks, group the plurality of output signal values as an ordered set in a multiplexer as a first composite signal and output the first composite signal.

One or more of the following features may also be included. The processor and the memory are incorporated into a personal computer. The processor and the memory are incorporated into a network server residing in the Internet. The processor and the memory are incorporated into a single board computer.

Embodiments of the invention may have one or more of the following advantages.

Block diagram modeling tools can be enhanced to use composite signals. Using composite signals results in an efficient graphical representation of a block diagram model.

Composite signals simplify the generation of a block diagram model and the resulting visual appearance of the block diagram model.

Composite signals simplify block diagram model navigation and signal selection. In addition, composite signals simplify block diagram model validation and integration of individual block diagram models.

Using composite signals reduces the memory requirements for graphical representation of the block diagram model and block diagram model execution. Further, using composite signals results in faster block diagram model execution, e.g., simulation and code generation.

Other features and advantages of the invention will become apparent from the following description, including the claims and drawings.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
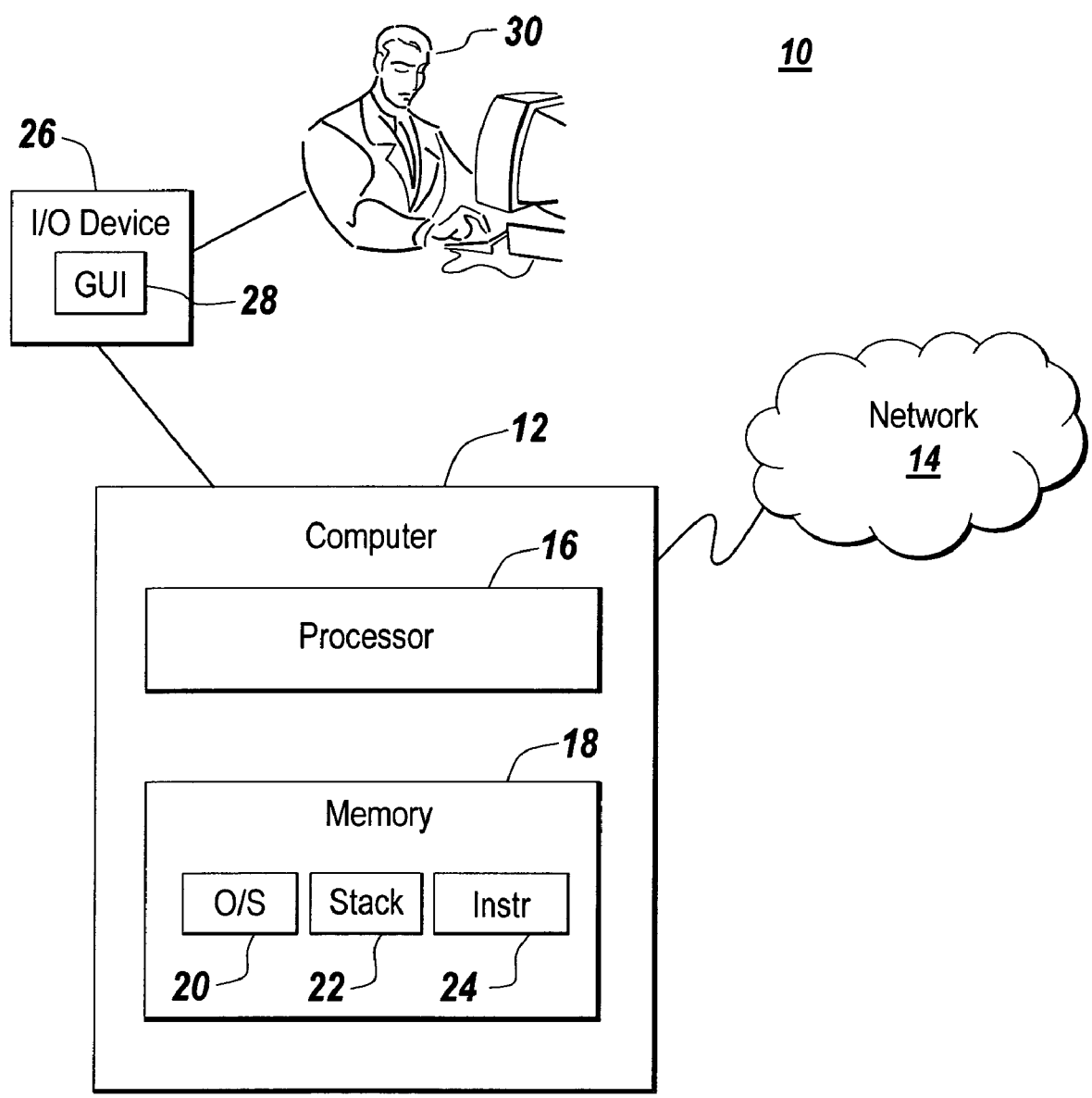
FIG. 1 is a block diagram of an exemplary processing system.

FIG. 1 shows a processing system 10. The processing system 10 includes a computer 12, such as a personal computer (PC). Computer 12 is connected to a network 14, such as the Internet, that runs TCP/IP (Transmission Control Protocol/Internet Protocol) or another suitable protocol. Connections may be via Ethernet, wireless link, telephone line, and so forth.

Computer 12 contains a processor 16 and a memory 18. Memory 18 stores an operating system ("OS") 20 such as Windows98® or Linux, a TCP/IP protocol stack 22 for communicating over network 14, and machine-executable instructions 24 executed by processor 16 to perform a block diagram modeling process 50 below. Computer 12 also includes an input/output (I/O) device 26 for display of a graphical user interface (GUI) 28 to a user 30.

Figure 2:
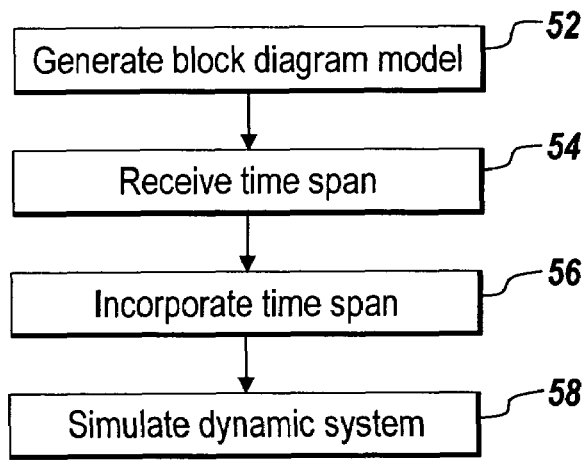
FIG. 2 is a flowchart of a block diagram modeling process.

Referring to FIG. 2, the block diagram modeling process 50 includes generating (52) a block diagram model of a dynamic system to be simulated and displayed on the graphical user interface (GUI) 28. The block diagram model graphically depicts the time-dependent mathematical relationships among the dynamic system's inputs, states, and outputs. The process 50 receives (54) a time span from the user 30. The process 50 incorporates (56) the time span into the block diagram model and simulates (58) the behavior of the dynamic system using the block diagram model for the specified time span.

Figure 3:
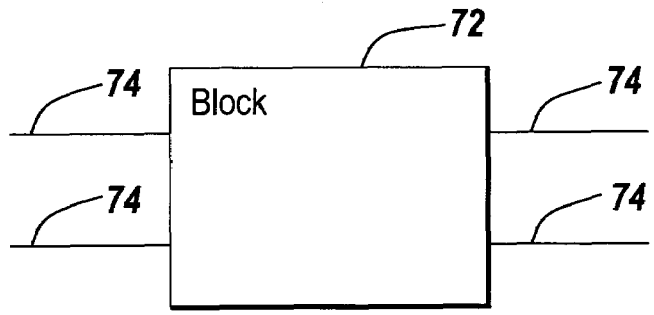
FIG. 3 is an illustration of a block diagram.

Referring to FIG. 3, the block diagram model 70 is a graphical representation of a dynamic system. The block diagram model 70 includes a set of one or more symbols, called blocks 72, interconnected by signal lines 74 that carry signals. Blocks 72 are functional entities that operate on signal values contained in the signal lines 74. Each block 72 can have zero or more input signal lines and zero or more output signal lines. Blocks 72 can have states. A state is a variable that determines a block's output and whose current value is a function of the previous values of the block's states and/or inputs. A block that has a state stores previous values of the state to compute its current state. States are thus said to be persistent. Blocks with states are said to have memory because such blocks store previous values of their states and/or inputs in order to compute the current values of the states.

In the block diagram model 70, signals contained in the signal lines 74 are the streams of values that appear at the output ports of blocks. It is useful to think of signals as values traveling along the lines that connect the blocks in the block diagram model 70. The signal can have a wide range of attributes, such as name, data type (e.g., 8-bit, 16-bit, or 32-bit integer), numeric type (e.g., real or complex), and dimensionality (e.g., one-dimension array, two-dimension array, or multi-dimensional array).

A composite signal represents an ordered set of signals that are bundled together to form a single entity. Signals in a composite signal can have different attributes, i.e., data types, numeric types, dimensionalities, and so forth. Therefore, the composite signal is a general facility for grouping and splitting a set of heterogeneous or homogeneous signals without loss of information.

For example, we can generate a block diagram model to simulate the water level in a simple dynamic system that includes a tank and a valve. We can also generate a block diagram model to simulate the water temperature of the same dynamic system. Level and temperature are two properties of the same entity, i.e., the water in the tank. Therefore, we can generate a composite signal that includes a "water temperature" signal and a "water level" signal. Using composite signals, the graphical representation of the block diagram model corresponds closely to the structure of the dynamic system. Thus, validation and integration of individual block diagram models into large system block diagram models is greatly simplified.

A composite signal may be defined mathematically by the three-tuple (S, C, f), where $S = \{s_1, s_2, \ldots, s_m\}$ is a set of single or independent signals;

$C = \{c_1, c_2, \ldots, c_n\}$ is a set of composite signals; and f(x, y) is a Boolean (true/false) function in which x and y are composite signals.

Boolean function f(x, y) is true if signal $x \in C$ contains signal $y \in C$, otherwise it is false.

Each composite signal $c_j$ is an ordered set, i.e., array, of single signals and composite signals, respectively. That is, given a composite signal $c_j = [c_{j1}, \ldots, c_{jp}, \ldots, c_{jk}]$, $c_j$ includes k signals where $c_{jp}$ is the $p^{th}$ signal of $c_j$ for $1 \leq p \leq k$. The $p^{th}$ signal can be an independent signal $c_{jp} \in S$ or a composite signal $c_{jp} \in C$ such that $c_j \neq c_{jp}$ and $f(c_{jp}, c_j) = $ false. $f(c_{jp}, c_j) = $ false indicates that there is no circular relationship (feedback or cycle) between two signals. In addition, since a composite signal is an ordered set of signals, a signal may appear several times in a composite signal. Thus, a composite signal may contain non-unique signals.

A composite signal may be represented in memory 18 using a tree data structure and implemented by the processor 16 as, for example, a linked list. A linked list is a dynamic data structure that may be implemented, for example, using the C language "struct" construct. A linked list includes individual nodes that are "linked" to each other via a pointer. Most operations that manipulate insertion, deletion, item look ups, or even counting the number of elements in a linked list entail traversing the linked list to search for the appropriate item or place in the list. Linked list operations are pointer manipulation intensive, however the trade off with flexibility in managing memory is well worth the effort.

The tree data structure contains m+n nodes, where m and n are the number of independent and composite signals. A link between two nodes in the tree data structure indicates that the signal at the start of the link contains the signal at the end of the link. The following example illustrates an exemplary tree data structure.

EXAMPLE 1

For ease of illustration, this first example includes three single signals $s_1$, $s_2$, and $s_3$, and two composite signals $c_1$ and $c_2$. Thus, $S = \{s_1, s_2, s_3\}$ and $C = \{c_1, c_2\}$. Composite signal $c_1$ includes two single signals $s_3$ and $s_2$, while composite signal $c_2$ includes four signals $s_1$, $s_2$, $s_2$ and $c_1$. Accordingly, $f(c_1, c_2) = $ false and $f(c_2, c_1) = $ true.

Figure 4:
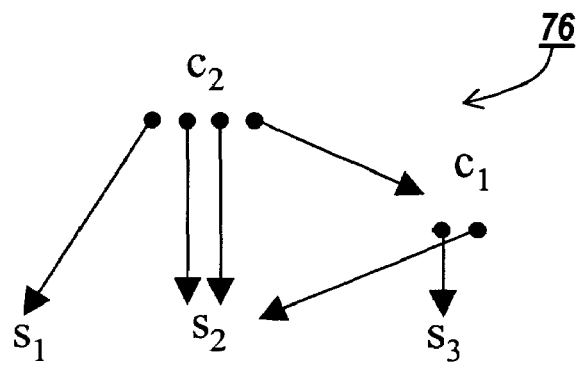
FIG. 4 is a tree structure diagram of example 1's composite signals.

Referring to FIG. 4, a tree structure 76 is shown illustrating one representation of the two composite signals $c_1$ and $c_2$. The tree data structure 76 contains five nodes, one node for each signal, i.e., $S_1$, $S_2$, $S_3$, $c_1$ and $c_2$. The link between two signals, represented by an arrowhead line, indicates a grouping relationship. Specifically, the four links (i.e., arrowhead lines) coming from composite signal $c_2$ indicate a grouping of four signals in composite signal $c_2$ while the two links coming from composite signal $c_1$ indicate a grouping of two signals in composite signal $c_1$. The link from composite signal $c_2$ to single signal $s_1$ indicates that composite signal $c_2$ contains single signal $s_1$. Likewise, the two links from composite signal $c_2$ to single signal $s_2$ indicate that composite signal $c_2$ contains two $s_2$ single signals. The link from composite signal $c_2$ to composite signal $c_1$ indicates the composite signal $c_2$ also includes composite signal $c_1$. Completing the example, the link from composite signal $c_1$ to single signal $s_2$ indicates that composite signal $c_1$ includes single signal $s_2$ and the link from composite signal $c_1$ to single signal $s_3$ indicates that composite signal $c_1$ also includes single signal $s_3$. The links are ordered left to right using black dots to preserve signal orders in the composite signals. Thus, the order of the black dots under composite signal $c_2$ indicates that its constituent signals are ordered as single signal $s_1$, single signal $s_2$, single signal $s_2$ and composite signal $c_1$. The order of black dots under composite signal $c_1$ indicates that its constituent signals are ordered as single signal $s_3$ and single signal $s_2$.

Figure 5A:
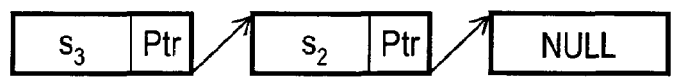
FIGS. 5A and 5B are linked list data structures.
Figure 5B:
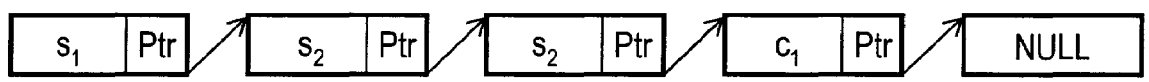

By way of further example, referring to FIG. 5A, a linked list 77 is used to represent the composite signals $c_1$, while referring to FIG. 5B, a linked list 78 is used to represent the composite signal $c_2$, wherein "Ptr" represents a pointer to the next linked list node in the linked lists 77 and 78.

Figure 6:
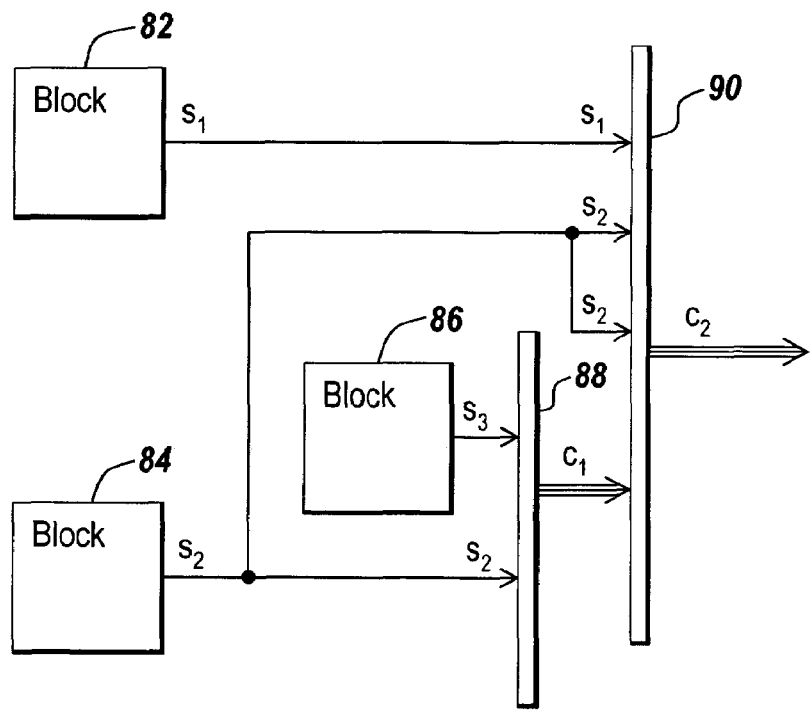
FIG. 6 is an illustration of a block diagram model of example 1.

Referring now to FIG. 6, a block diagram model 80 represented by the tree data structure in Example 1 includes three blocks labeled 82, 84 and 86, respectively. Block 82 generates a signal $s_1$, while block 84 generates signal $s_2$ and block 86 generates signal $s_3$. Signals $s_3$ and $s_2$ enter a multiplexer 88. Output from the multiplexer 88 is composite signal $c_1$, which includes signal $s_3$ and $s_2$.

Signal $s_1$, two $s_2$ signals, and composite signal $c_1$ enter a multiplexer 90. Output from multiplexer 90 is composite signal $c_2$, which includes single signals $s_1$, $s_2$, $s_2$ and composite signal $c_1$.

It should be noted that the composite signals are represented as triple arrowhead lines for ease of viewing and to differentiate them from single signals that are represented as single arrowhead lines.

Each multiplexer generates a composite signal. For example, if the composite signal is stored as a linked list, the multiplexer generates a linked list containing nodes, each of the nodes representing the constituent signals of the composite signal. A multiplexer has multiple input ports for receiving multiple input signals and one output port for sending out one composite signal. Each input signal can be an independent signal or a composite signal. The output signal is a composite signal. Cascading multiplexers can define signal hierarchy in the composite signal.

In a block diagram model, each block has different behaviors. Each block can accept and output signals with different attributes. If a block accepts individual signals in a composite signal, the block accepts the corresponding composite signal, and it outputs a composite signal as well. This is because all properties of signals in a composite signal are preserved. This improves generated instructions 24 and results in faster model execution (simulation).

EXAMPLE 2

This second example builds on the block diagram model of Example 1 by including a gain block. A gain block is an example of a stateless block. The gain block outputs its input signal multiplied by a constant called a gain. The output of a gain block is determined entirely by the current value of the input and the gain, which does not vary. A gain block therefore has no states.

If a gain block with a gain parameter K is driven by the composite signal $c_1$ in Example 1, the output composite signal is $K*c_1 = [K*s_3, K*s_2]$. Remember that composite signal $c_1$ includes single signals $s_3$ and $s_2$. The gain block accepts a composite signal and outputs a composite signal, the same way a gain block accepts a single signal and outputs a single signal. For example, if a gain block with the gain parameter K is driven by the single input signal $s_1$, the output single signal is $K*s_1$.

Mathematically, the computational complexity of processing a composite signal and a set of independent single signals in the processor 16 is the same. Practically, processing a composite signal in the processor 16 is faster than processing each single signal individually. This is because, in the case of a composite signal, function-call overhead in the processor 16 for processing each single signal individually is eliminated. In Example 2 above, if a composite signal includes four signals, instead of having four gain blocks, one to amplify each of the four input signals, one gain block is used to amplify a composite signal that includes four constituent signals.

When a block operates on a composite signal, the attributes of the resulting composite signal may not be the same as the original composite signal attributes. For example, if K is a [3×2] matrix, and $s_1$ is a [2×4] matrix contained within a composite signal, the first signal of the output composite signal is a [3×4] matrix. Therefore, the dimensionality attribute of the first signal in the input and output composite signals is different.

Figure 7:
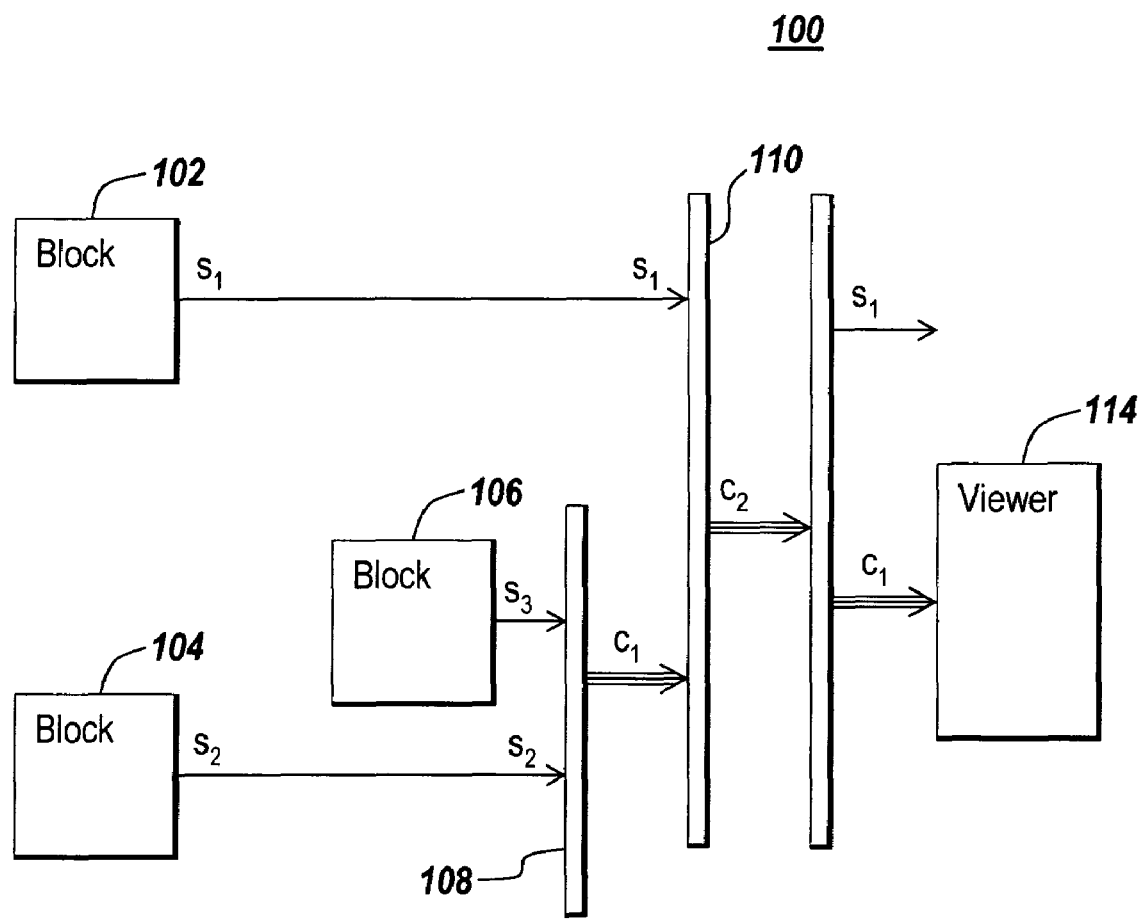
FIG. 7 is an illustration of a block diagram model including a demultiplexer and a viewer.

Referring to FIG. 7, an exemplary block diagram model 100 includes three blocks 102, 104 and 106. Block 102 generates a single signal $s_1$, while block 104 generates single signal $s_2$ and block 106 generates single signal $s_3$. Signals $s_3$ and $s_2$ enter a multiplexer 108. Output from the multiplexer 108 is a composite signal $c_1$ that includes signals $s_3$ and $s_2$.

Single signal $s_1$ and composite signal $c_1$ enter multiplexer 110. Output from multiplexer 110 is a composite signal $c_2$ that includes single signal $s_1$ and composite signal $c_1$. Composite signal $c_2$ enters demultiplexer 112. Output from demultiplexer 112 is single signal $s_1$ and composite signal $c_1$.

In general, a demultiplexer has one input port and one or more output ports. The input port receives a composite signal and each output port outputs a selected signal from the composite input signal. For example, if the composite signal is stored as a linked list, the demultiplexer traverses the linked list, outputting each of the linked list elements, i.e., signals. Thus, one or more demultiplexers complement one or more multiplexers, i.e., each multiplexer builds a composite signal and each demultiplexer decomposes a composite signal into one or more of its component parts (single signals and/or composite signals).

The block diagram model 100 also includes a composite signal viewer block 114. The composite signal viewer block 114 provides graphic visualization of a composite signal to the user 30 on the graphical user interface 28 of the input/output device 26.

A composite signal viewer block may be coupled to any composite signal. A composite signal viewer block has one input port and no output port. The one input port receives an input signal that is a composite signal. The composite signal viewer block provides graphical visualization of the hierarchical organization of the composite signal input.

Figure 8:
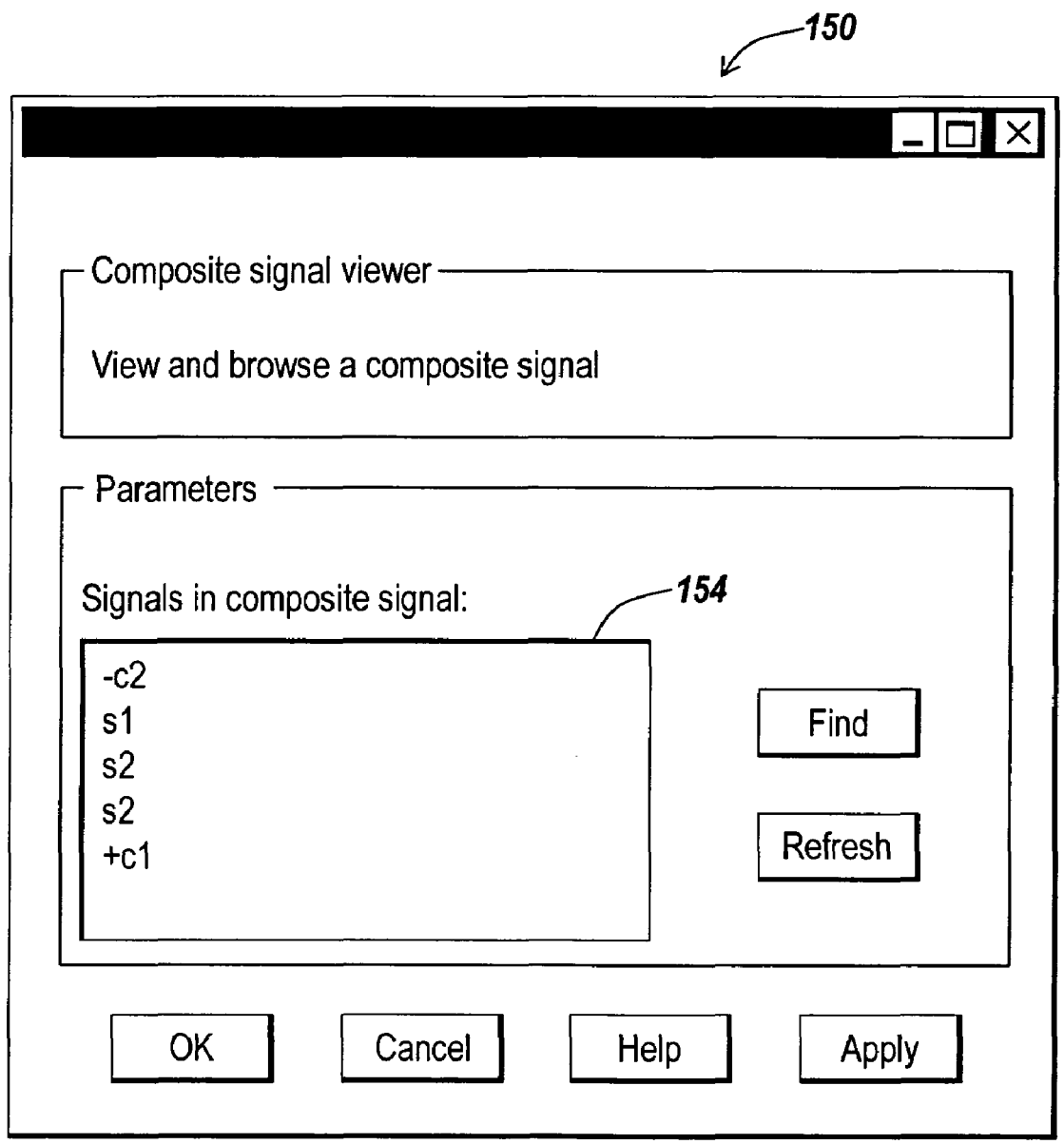
FIG. 8 is an illustration of a first composite signal viewer graphical user interface (GUI).

Referring to FIG. 8, an action of the user 30 "clicking on" the composite signal viewer block generates a composite signal viewer graphical user interface (CS-GUI) 150 that displays the constituent signals in the composite signal by traversing the tree structure representing the composite signal, such as a linked list. Using composite signal $c_2$ of FIG. 6 as an example, the CS-GUI 150 includes a section 154 indicating the constituent signals in the composite signal. In the example, $c_2$ includes four signals, i.e., $s_1$, $s_2$, $s_2$ and $c_1$.

Figure 9:
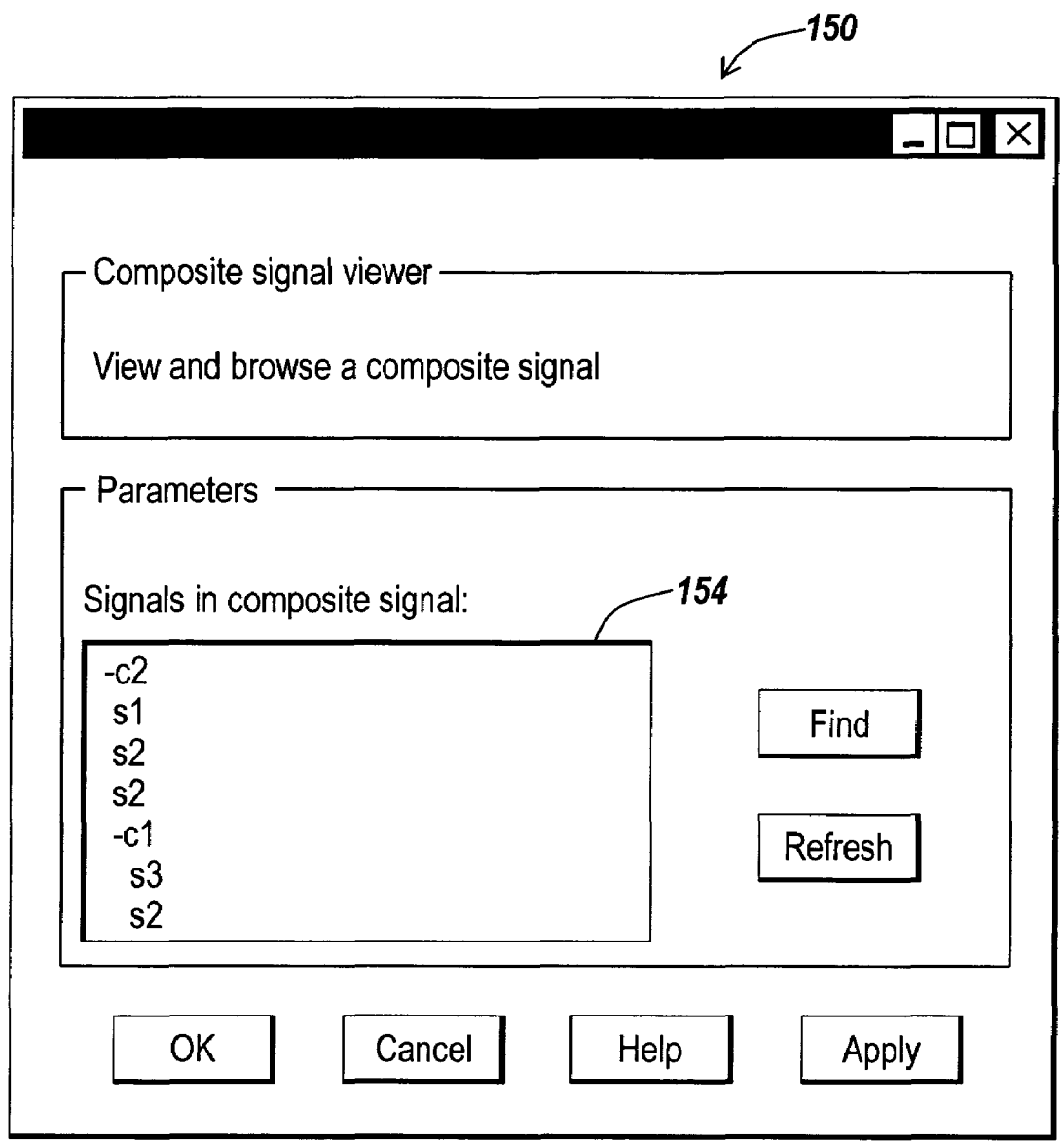
FIG. 9 is an illustration of a second composite signal viewer GUI.

Referring to FIG. 9, an action of the user 30 "clicking on" the composite signal $c_1$ in the section 154 of FIG. 8 results in an output in section 154 displaying the two signals $s_3$ and $s_2$ included in composite signal $c_1$. Thus, the composite signal viewer 150 provides the user 30 the ability to view and browse any composite signal.

Process 50 is not limited to use with the hardware/software configuration of FIG. 1; it may find applicability in any computing or processing environment. Process 50 may be implemented in hardware (e.g., an ASIC {Application-Specific Integrated Circuit} and/or an FPGA {Field Programmable Gate Array}), software, or a combination of hardware and software.

Processes 50 may be implemented using one or more computer programs executing on programmable computers that each includes a processor, a storage medium readable by the processor (including volatile and non-volatile memory and/or storage elements), at least one input device, and one or more output devices.

Each such program may be implemented in a high level procedural or object-oriented programming language to communicate with a computer system. Also, the programs can be implemented in assembly or machine language. The language may be a compiled or an interpreted language.

Each computer program may be stored on a storage medium or device (e.g., CD-ROM, hard disk, or magnetic diskette) that is readable by a general or special purpose programmable computer for configuring and operating the computer when the storage medium or device is read by the computer to perform process 50.

Process 50 may also be implemented as a computer-readable storage medium, configured with a computer program, where, upon execution, instructions in the computer program cause the computer to operate in accordance with process 50.

Further aspects, features and advantages will become apparent from the following.

What is claimed is:

1. A computer implemented modeling process comprising:
   providing a plurality of blocks, each of the blocks representing functional entities;
   generating a plurality of output signals from the plurality of blocks, each output signal having at least one attribute;
   grouping the plurality of output signals as an ordered set in a multiplexer as a first composite signal;
   outputting the first composite signal, the first composite signal preserving the at least one attribute of each output signal;
   storing the first composite signal in a storage device; and
   decomposing the first composite signal into the plurality of output signals.

2. The process of claim 1 wherein each of the blocks includes at least one output signal port.

3. The process of claim 1 wherein the attribute is a name.

4. The process of claim 1 wherein the attribute is a data type.

5. The process of claim 1 wherein the attribute is a numeric type.

6. The process of claim 1 wherein the attribute is a dimensionality.

7. The process of claim 1 wherein the ordered set is a linked list data structure.

8. The process of claim 7 wherein the linked list data structure is a tree data structure, the tree data structure including m+n nodes, wherein m represents a number of independent signals and n represents a number of composite signals.

9. The process of claim 1 further comprising:
   using a demultiplexer to the decompose first composite signal into the plurality of output.

10. The process of claim 1 further comprising viewing the ordered set contained in the first composite signal with a composite signal viewer.

11. The process of claim 1 wherein at least one of the output signals is a second composite signal.

12. The process of claim 1, further comprising:
    representing a non-composite signal with a first graphical element, and
    representing the composite signal with a second graphical element, wherein the second graphical element is visually different than the first graphical element.

13. A computer implemented block diagram modeling process comprising:
    providing a first block and a second block, the blocks representing functional entities;
    generating a plurality of output signals from the first and second block, each output signal having at least one attribute;
    grouping the plurality of output signals as an ordered set in a multiplexer as a first composite signal, the first composite signal preserving the at least one attribute of each output signal;
    processing the composite signal in a third block;
    storing the composite signal in a storage device; and
    decomposing the composite signal into the plurality of output signal.

14. The process of claim 13 wherein the ordered set is a linked list data structure.

15. The process of claim 13 wherein an output signal is a second composite signal.

16. The process of claim 13 further comprising viewing the composite signal in a composite signal viewer.

17. The process of claim 16 wherein the composite signal viewer displays the ordered set contained in the composite signal on a graphical user interface (GUI).

18. The process of claim 17 wherein the GUI is provided on an input/output device.

19. A computer program product residing on a computer readable medium having instructions stored thereon which, when executed by the processor, cause the processor to:
    provide a plurality of blocks, each of the blocks representing functional entities;
    generate a plurality of output signals from the plurality of blocks, each output signal having at least one attribute;
    group the plurality of output signals as an ordered set in a multiplexer as a first composite signal, the first composite signal preserving the at least one attribute of each output signal;
    output the first composite signal;
    store the first composite signal in a storage device; and
    decompose the first composite signal into the plurality of output signals.

20. The computer program product of claim 19 wherein the computer readable medium is a random access memory (RAM).

21. The computer program product of claim 19 wherein the computer readable medium is read only memory (ROM).

22. The computer program product of claim 19 wherein the computer readable medium is hard disk drive.

23. A processor and a memory configured to:
    provide a plurality of blocks, each of the blocks representing functional entities;
    generate a plurality of output signals from the plurality of blocks, each output signal having at least one attribute;

group the plurality of output signal values as an ordered set in a multiplexer as a first composite signal, the first composite signal preserving the at least one attribute of each output signal;

output the first composite signal;

store the first composite signal in a storage device; and decompose the first composite signal into the plurality of output signals.

24. The processor and memory of claim 23 wherein the processor and the memory are incorporated into a personal computer.

25. The processor and memory of claim 23 wherein the processor and the memory are incorporated into a network server residing in the Internet.

26. The processor and memory of claim 23 wherein the processor and the memory are incorporated into a single board computer.

27. A computer implemented modeling process comprising:

providing a plurality of blocks, each of the blocks representing a functional entity that generates one or more output signals, each output signal having at least one attribute;

grouping the output signals as an ordered set in a multiplexer as a composite signal, the composite signal preserving the at least one attribute of each output signal;

outputting the composite signal;

storing the composite signal in a storage device; and decompose the composite signal into the one or more output signals.

28. The process of claim 27 wherein the ordered set is a tree data structure.

29. The process of claim 28 wherein the tree data structure is a linked list.

30. The process of claim 27 further comprising:

providing a composite signal viewer; and viewing the ordered set in a graphical user interface executing in the composite signal viewer.

31. A computer program product residing on a computer readable medium having instructions stored thereon which, when executed by the processor, cause the processor to:

provide a plurality of blocks, each of the blocks representing a functional entity that generates one or more output signal values, each output signal having at least one attribute;

group the output signals as an ordered set in a multiplexer as a composite signal, the composite signal preserving the at least one attribute of each output signal;

output the composite signal;

store the composite signal in a storage device; and decompose the composite signal into the one or more output signals.

32. A processor and memory configured to provide a plurality of blocks, each of the blocks representing a functional entity that generates one or more output signals, each output signal having at least one attribute;

group the output signals as an ordered set in a multiplexer as a composite signal, the composite signal preserving the at least one attribute of each output signal;

output the composite signal;

store the composite signal in a storage device; and decompose the composite signal into the one or more output signals.

33. A method for providing a composite signal in a modeling environment, the method comprising the steps of:

providing a plurality of output signals from one or more blocks, each output signal having at least one attribute;

generating a composite signal comprising a set of the plurality of output signals, the composite signal preserving the at least one attribute of each output signal;

outputting the composite signal;

storing the composite signal in a storage device; and decomposing the composite signal into the one or more output signals.

34. A method for graphically representing a composite signal in a modeling environment, the method comprising the steps of:

providing a plurality of output signals from one or more blocks, each output signal graphically indicated by a signal identifier, each output signal having at least one attribute;

providing a composite signal identifier to graphically indicate a grouping of signal identifiers, the composite signal identifier representing a composite signal comprising a set of the plurality of output signals, the composite signal preserving the at least one attribute of each output signal;

storing the composite signal identifier in a storage device; and decomposing the composite signal into the one or more output signals.

* * * * *

UNITED STATES PATENT AND TRADEMARK OFFICE
CERTIFICATE OF CORRECTION

| | |
|---|---|
| PATENT NO. | : 7,433,812 B2 |
| APPLICATION NO. | : 09/870280 |
| DATED | : October 7, 2008 |
| INVENTOR(S) | : Mojdeh Shakeri et al. |

Page 1 of 1

It is certified that error appears in the above-identified patent and that said Letters Patent is hereby corrected as shown below:

At column 8, line 3 (Claim 9) add "signals" after --output--.

Signed and Sealed this

Twenty-seventh Day of January, 2009

JOHN DOLL
*Acting Director of the United States Patent and Trademark Office*